(12) United States Patent
Narasimhan et al.

(10) Patent No.: US 8,031,101 B2
(45) Date of Patent: Oct. 4, 2011

(54) SPUR CANCELLATION

(75) Inventors: Ravi Narasimhan, Los Altos, CA (US);
Andrea Goldsmith, Menlo Park, CA (US)

(73) Assignee: Quantenna Communications, Inc., Fremont, CA (US)

( * ) Notice: Subject to any disclaimer, the term of this patent is extended or adjusted under 35 U.S.C. 154(b) by 0 days.

(21) Appl. No.: 12/705,416

(22) Filed: Feb. 12, 2010

(65) Prior Publication Data
US 2010/0214145 A1 Aug. 26, 2010

Related U.S. Application Data

(60) Provisional application No. 61/152,243, filed on Feb. 12, 2009.

(51) Int. Cl.
*H03M 1/12* (2006.01)
(52) U.S. Cl. ..... 341/155; 341/118; 341/120; 455/114.1; 455/114.2; 455/127.1; 455/130
(58) Field of Classification Search .......... 341/118–121, 341/155; 455/114.2, 114.3, 127.1, 165.1, 455/130
See application file for complete search history.

(56) References Cited

U.S. PATENT DOCUMENTS

| | | | | |
|---|---|---|---|---|
| 6,081,215 A * | 6/2000 | Kost et al. | ...................... | 341/120 |
| 6,560,447 B2 * | 5/2003 | Rahman et al. | ............. | 455/232.1 |
| 6,606,359 B1 * | 8/2003 | Nag et al. | ...................... | 375/348 |
| 7,009,536 B1 * | 3/2006 | Gaus, Jr. | ...................... | 341/118 |
| 7,304,597 B1 * | 12/2007 | LaMarche | ...................... | 341/155 |
| 7,317,774 B2 * | 1/2008 | Richey et al. | ................. | 375/355 |
| 7,321,631 B1 * | 1/2008 | Choi et al. | .................... | 375/260 |
| 7,835,456 B2 * | 11/2010 | Choi et al. | .................... | 375/260 |
| 2003/0103589 A1 * | 6/2003 | Nohara et al. | ................ | 375/350 |
| 2003/0128141 A1 * | 7/2003 | Asami | ........................... | 341/120 |
| 2005/0059366 A1 * | 3/2005 | Choi et al. | ................... | 455/130 |
| 2006/0269004 A1 | 11/2006 | Ibrahim et al. | | |
| 2006/0281425 A1 * | 12/2006 | Jungerman | .............. | 455/183.2 |
| 2007/0273567 A1 * | 11/2007 | LaMarche | ..................... | 341/144 |
| 2011/0007839 A1 * | 1/2011 | Tang et al. | .................... | 375/296 |

OTHER PUBLICATIONS

Co-pending U.S. Appl. No. 12/630,814, filed Dec. 3, 2009.
Co-pending U.S. Appl. No. 12/753,807, filed Apr. 2, 2010.
Co-pending U.S. Appl. No. 12/754,578, filed Apr. 5, 2010.

* cited by examiner

*Primary Examiner* — Linh Nguyen
(74) *Attorney, Agent, or Firm* — Sheppard Mullin Richter & Hampton LLP

(57) ABSTRACT

A technique to mitigate in-band spurs introduced into a signal due to various board/SiP layout issues at a receiver is disclosed. The spurs can be approximated as sinusoids at different known frequencies with unknown amplitudes and phases. The technique is applicable to both single and multiple spur cancellation.

26 Claims, 4 Drawing Sheets

US 8,031,101 B2

SPUR CANCELLATION

CROSS-REFERENCE TO RELATED APPLICATIONS

This application claims priority to U.S. Provisional Patent Application No. 61/152,243, filed on Feb. 12, 2009, and which is incorporated by reference.

BACKGROUND

A signal sent from a radio transmitter to a radio receiver typically has interference introduced on the channel. In addition, there are typically multiple in-band spurs present within the signal bandwidth at a receiver because of various board/SiP layout issues. The spurs cause degradation in receiver performance.

There have been efforts to accomplish spur cancellation, and research into spur cancellation is ongoing. For example, it may be possible to puncture bits affected by spurs at an FEC decoder; or downconvert the spur to DC, remove DC by a filter, and upconvert back. However, the approaches are generally impractical when multiple spur frequencies are present. Thus, these techniques can be referred to as "single spur cancellation techniques."

SUMMARY

The following is described and illustrated in conjunction with systems, tools, and methods that are meant to be exemplary and illustrative, not limiting in scope. In various embodiments, one or more of the above-described problems have been reduced or eliminated, while other embodiments are directed to other improvements.

It may be desirable to mitigate in-band spurs introduced into a signal due to various board/SiP layout issues at a receiver. The spurs can be approximated as sinusoids at different known frequencies with unknown amplitudes and phases. Spurs are often caused by one or more clocks in a system that couple through board traces to radio frequency integrated circuit (RFIC) receiver ports. So, for example, some spurs can be associated with a clock of an analog-to-digital converter in a receiver. In such a case, it was observed that frequencies of the spurs can be measured; to do so, you look at the harmonics (e.g., integer multiples) of the clock frequency. That is why spurs can be approximated as sinusoids at different known frequencies.

It may also be desirable to cancel other artifact signals associated with the board/SiP/components in the analog part of a receiver, including harmonic spurs, by representing them as a sum of basis functions (e.g. sinusoids, best matched to harmonic spurs, or sinusoids or wavelets to model a broader class of artifact signals). Multiple spur cancellation may be more desirable than single spur cancellation, but while multiple spur cancellation was a design goal during the development of the techniques that are the subject of this paper, certain techniques may be applicable to a system that accomplishes only single spur cancellation. Specific examples of techniques to accomplish spur cancellation are described in the detailed description that follows.

BRIEF DESCRIPTION OF THE DRAWINGS

Examples of the claimed subject matter are illustrated in the figures.

DETAILED DESCRIPTION

In the following description, several specific details are presented to provide a thorough understanding of examples of the claimed subject matter. One skilled in the relevant art will recognize, however, that one or more of the specific details can be eliminated or combined with other components, etc. In other instances, well-known implementations or operations are not shown or described in detail to avoid obscuring aspects of the claimed subject matter.

Figure 1:
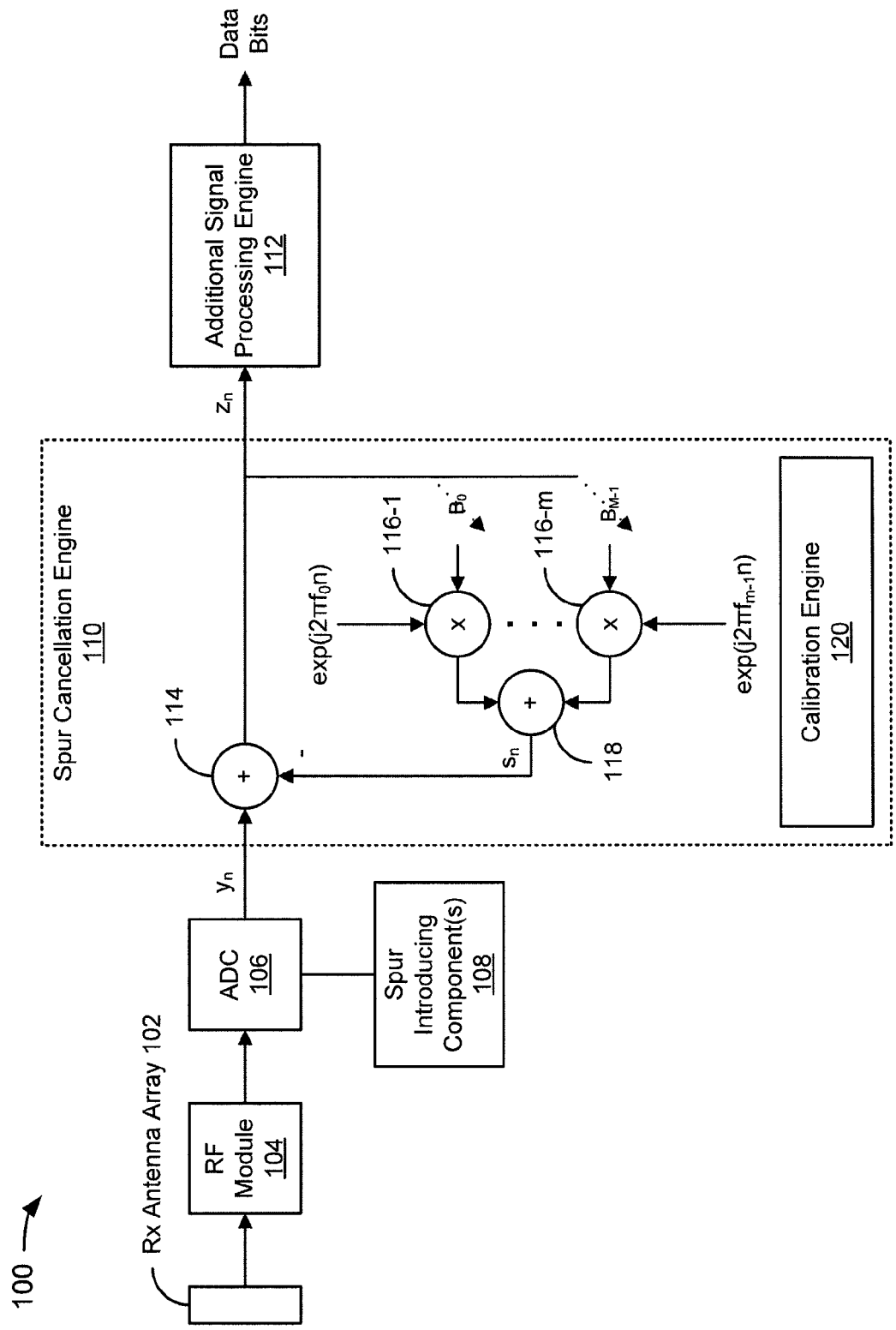
FIG. 1 depicts an example of a spur canceling radio frequency receiver system.

FIG. 1 depicts an example of a spur canceling radio frequency (RF) receiver (Rx) system 100. The system 100 can be implemented in whole or in part on a chip and/or as an RF integrated circuit (RFIC). The system 100 includes an Rx antenna array 102, an RF module 104, an analog-to-digital converter (ADC) 106, spur introducing component(s) 108, a spur cancellation engine 110, and an additional signal processing engine 112.

In the example of FIG. 1, the Rx antenna array 102 includes one or more antennae. (It may be noted that an array of one antenna is normally not referred to as an "array," but the distinction is not critical to an understanding of the example.) Where there are multiple antennae in the array, the antennae can be coupled to a common source or load to produce a directive radiation pattern. The spatial relationship can contribute to the directivity of the antennae.

In the example of FIG. 1, in operation, the Rx antenna array 102 receives a signal from a station (not shown). A station, as used in this paper, may be referred to as a device with a media access control (MAC) address and a physical layer (PHY) interface to a wireless medium that complies with the Institute of Electrical and Electronics Engineers (IEEE) 802.11 standard. In alternative embodiments, a station may comply with a different standard than IEEE 802.11, or no standard at all, may be referred to as something other than a "station," and may have different interfaces to a wireless or other medium. IEEE 802.11a-1999, IEEE 802.11b-1999, IEEE 802.11g-2003, IEEE 802.11-2007, and IEEE 802.11n TGn Draft 8.0 (2009) are incorporated by reference. As used in this paper, a system that is 802.11 standards-compatible or 802.11 standards-compliant complies with at least some of one or more of the incorporated documents' requirements and/or recommendations, or requirements and/or recommendations from earlier drafts of the documents.

Depending upon whether there are multiple antennae at the station, in a transmit (Tx) antenna array, and/or multiple antennae in the Rx antenna array 102, the communication link between the station and the system 100 can be referred to as a multiple-input multiple-output (MIMO) link. It should be noted that multiple-input and single-output (MISO), single-input and multiple-output (SIMO), and single-input and single-output (SISO) are special cases of MIMO. MISO is when the receiver has a single antenna. SIMO is when the transmitter has a single antenna. SISO is when neither the transmitter nor the receiver have multiple antennae. The acronym MIMO could be considered to include the special cases, if applicable. The techniques may also be applicable to multi-user MIMO (MU-MIMO), cooperative MIMO (CO-MIMO), MIMO routing, OFDM-MIMO, or other MIMO technologies. The major consideration with respect to multiple antennae use as it relates to the techniques described in this paper is whether there are multiple antennae at the receiver (MIMO or SIMO) or not (SIMO or SISO). When there are multiple antennae at the receiver, there are typically multiple corresponding RF chains and other components including, potentially, multiple spur cancellation circuits, and, potentially, one for each antennae. This characteristic will be identified later when it is relevant for a particular component.

In the example of FIG. 1, signals are collected by the Rx antennae array 102 and downconverted to analog baseband waveforms at the RF module 104. The RF module 104 may include, for example, Rx RF chains that are part of a circuit that includes a controller capable of tuning to a desired carrier frequency. It is not particularly critical how the RF module 104 is implemented, and any applicable known or convenient RF module could be used. It should be noted, however, that different configurations or components may or may not introduce different spurs.

In the example of FIG. 1, the analog baseband waveforms are digitized at the ADC 106. It is not particularly critical how the ADC 106 is implemented, and any applicable known or convenient ADC could be used. It should be noted, however, that different configurations or components may or may not introduce different spurs. A digital signal, $y_n$, is shown as the output of the ADC 106, where "y" represents a digital signal and "n" represents a point (or interval) of time. The digital signal $y_n$ can be referred to as a signal, or as a complex baseband representation of a signal, depending upon which makes more sense in the given context. For example, when $y_n$ is used in an equation, it might make more sense to refer to it as a representation of a signal, rather than the signal itself.

In the example of FIG. 1, the spur introducing component(s) 108, as its name suggests, introduces one or more'spurs into the digital signal $y_n$. The spur introducing component(s) 108 can include an antenna of the Rx antenna array 102, an RF chain of the RF module 104, the ADC 106, one or more elements of any of these components, or an association component (not shown), such as a clock coupled through board traces to an RFIC receiver port associated with the ADC. Thus, the spur introducing component(s) 108 and partially or wholly "overlap" with any of the illustrated components between the Rx antenna array 102 and the spur cancellation engine 110, or with any other component so long as the spur is introduced into the digital signal $y_n$ prior to the spur cancellation engine 110 processing the signal.

For illustrative purposes, it is assumed that the digital signal $y_n$ has one or more spurs introduced by one or more components. The number of spurs to cancel varies depending upon design/implementation-, configuration-, and/or application-specific parameters. In experiments, it was determined that a typical range of spurs to be canceled was from one to five. The small number is due to the practical fact that a spur can be ignored without (or without significant) degradation to the signal if the amplitude is X dB below the signal, where X depends on the modulation and coding scheme (MCS). Alternatively, a spur can be ignored if the amplitude is less than Y dB above the noise, where Y again depends upon the MCS.

In the example of FIG. 1, the spur cancellation engine 110 provides the spur-compensated digital signal $z_n$ to the additional signal processing engine 112. The spur-compensated digital signal $z_n$ is intended to represent the digital signal $y_n$ following cancellation of the spurs. The additional signal processing engine 112 can include any applicable known or convenient components, such as an equalizer, constellation demappers, bit deinterleavers, etc. Since the focus of this paper is on spur cancellation to produce the spur-compensated digital signal $z_n$, a detailed description of processing following the production of the spur-compensated digital signal $z_n$ is not provided. In general, a person of skill in the relevant art who understands how to process a signal after the signal is converted to digital by an ADC would have no difficulty applying the same processing techniques to the spur-compensated digital signal $z_n$. Following the additional processing, the output of the additional signal processing engine 112 is, assuming no uncorrectable errors occurred, data bits that were sent from the station to the system 100.

In an embodiment that includes multiple antennae in the Rx antenna array 102 (e.g., MIMO or SIMO), there may be a corresponding RF module (perhaps with shared components, such as a shared controller), a corresponding ADC (perhaps with shared components), a corresponding spur cancellation engine 110 (perhaps with shared components), and corresponding paths in the additional signal processing engine 112 (perhaps with shared components) for each antenna. In such a case, there may be a different digital signal output from each of the ADCs. It may be noted that where a shared component introduces the same spurs across multiple antenna RF chains, a multi-chain spur cancellation engine could be implemented. However, it is reasonably likely that an easier implementation is to dedicate a spur cancellation engine to each antenna and related components, and simply cancel the spur independently in each signal. For illustrative simplicity, it is assumed that each signal has its own dedicated spur cancellation engine (potentially with shared components), and the description provided in this paper for the spur cancellation engine 110 associated with the digital signal $y_n$ would be applicable to other spur cancellation engines in a MIMO or SIMO system.

In the example of FIG. 1, the spur cancellation engine 110 includes an adder 114, multipliers 116-1 to 116-$m$ (referred to collectively as the multipliers 116), an adder 118, and a calibration engine 120. Advantageously, the components are digital (as evidenced by the fact that they follow the ADC 106 in the signal processing chain) which, in general, decreases size, power requirements, and cost relative to comparable analog components. The specific elements of the spur cancellation engine 110 are depicted so as to illustrate a specific embodiment of a mechanism for canceling signal-dependent spurs on a receiver system. However, a person of skill in the relevant art with this paper before them may be capable of deviating from the specific embodiment in order to accomplish spur cancellation for signal-dependent spurs on a receiver system.

In the specific embodiment of the spur cancellation engine 110 in FIG. 1, the adder 114 receives two inputs: the digital signal $y_n$ and the spur cancellation signal $s_n$. By combining these two signals, the system 100 can remove a spur from the digital signal $y_n$. In the example of FIG. 1, the signals are combined by subtracting spur cancellation signal $s_n$ from the digital signal $y_n$. The decision to use an adder and to subtract $s_n$ from $y_n$ is considered to be a relatively straight-forward means for accomplishing the goal of combining the signals to obtain a spur-compensated digital signal $z_n$. However, the adder 114 could more generally be referred to as a "signal combiner," and the signals $s_n$ from $y_n$ could be combined in an applicable known or convenient manner.

Figure 2:
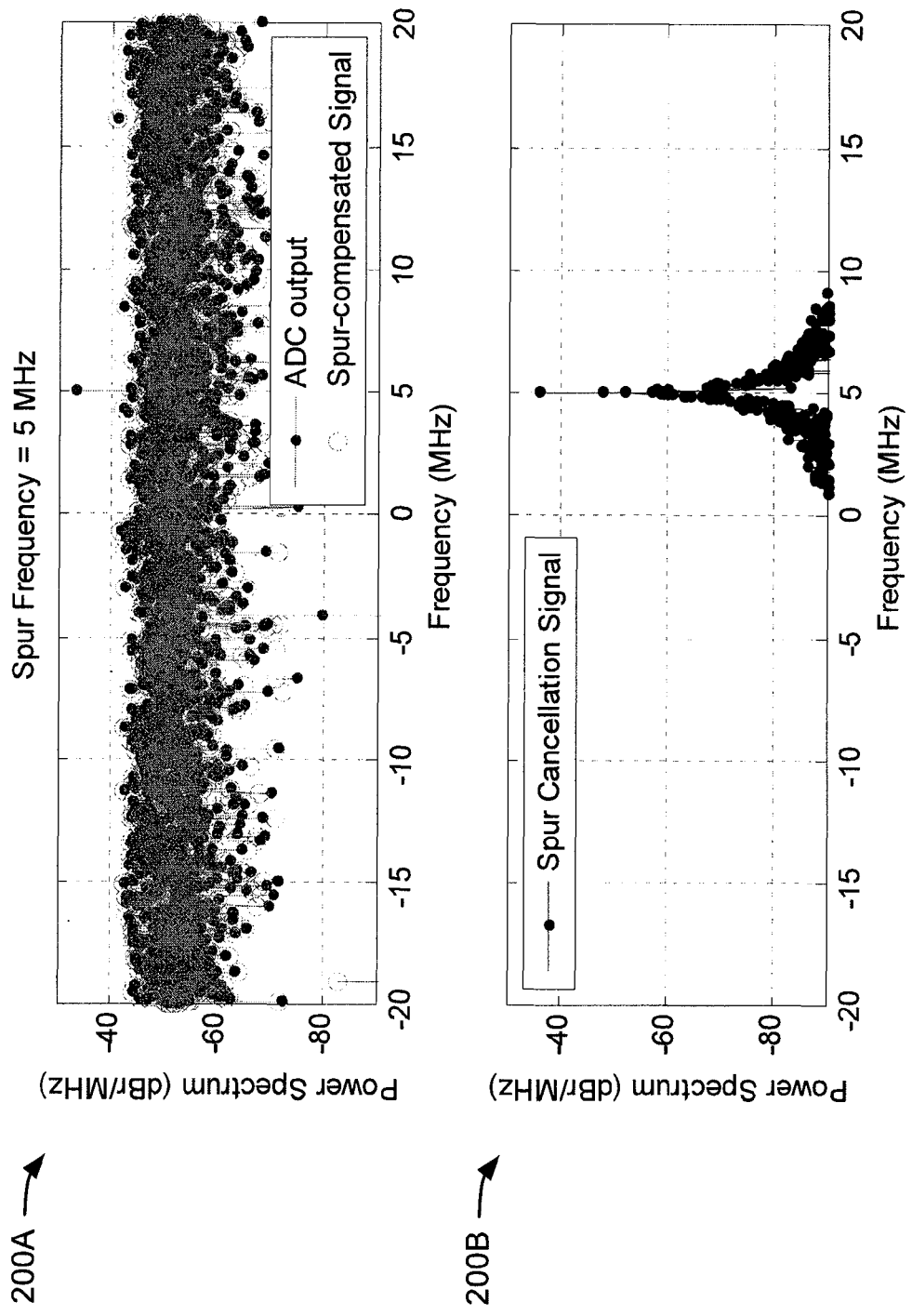
FIG. 2 depicts graphs conceptually illustrating how a single spur at a known frequency with unknown and constant phase can be canceled.

FIG. 2 depicts graphs 200A and 200B conceptually illustrating how a single (M=1) spur at a known frequency (f=5 MHz) with unknown and constant phase can be canceled. The graph 200A plots frequency (MHz) to power spectrum (dBr/MHz). In the graph, a spur 202 is ADC output in an unacceptable power spectrum range (over −40 in this illustration).

Since the spur is identifiable, a spur cancellation signal 204, illustrated in the graph 200B, can "zap" the spur 202, effectively removing it.

In the specific embodiment of the spur cancellation engine 110 in FIG. 1, the multipliers 116 have associated coefficients $B_0$ to $B_{M-1}$ (referred to collectively as the coefficients B). Adaptation of the coefficients can be done during a quiet period, and the coefficients can be frozen when receiving a packet. In this way, the circuit is stable while processing the digital signal $y_n$. The multipliers receive input values that can be represented, in this example, as $\exp(j2\pi Fn)$, where F varies depending upon a (known) frequency associated with the particular multiplier. Where there are M multipliers, there will be M values of F: $f_0, f_1 \ldots f_{M-1}$. There is no reason in this example for the values to be in any particular order (e.g., from low to high or high to low), but the coefficients $B_0$ to $B_{M-1}$ are associated with the multipliers 116 receiving as input the values $\exp(j2\pi f_0 n)$ to $\exp(j2\pi F_{M-1} n)$. The combination of a coefficient $B_0$ and the $\exp(j2\pi f_0 n)$ yields the equation $s=B_0[n]\exp(j2\pi f_0 n)$, where $B_0[n]$ are adaptive spur cancellation amplitudes and phases. For any frequency $f_m$ and coefficient $B_m$, a similar equation can be derived. The decision to use a multiplier to combine the associated coefficient and exponential value is considered to be a relatively straight-forward means for accomplishing the goal of combining the values to obtain spur cancellation signals. However, the multipliers could more generally be referred to as "spur cancellation signal computation engines" and could generate the spur cancellation signals in an applicable known or convenient manner.

In the specific embodiment of the spur cancellation engine 110 in FIG. 1, the adder 118 receives as input the output of each of the multipliers and combines them. In this way, the adder 118 can produce the spur cancellation signal $s_n$ with one spur cancellation signal for each of the multipliers 116. In the specific embodiment of the spur cancellation engine 110, the spur cancellation signal can be represented by the equation $s_n = \Sigma(m=0 \ldots M-1)\{B_m[n]\exp(j2\pi f_m n)\}$. That is, the sum of each of the values, s, where there are M spur frequencies to be canceled. The decision to use an adder to combine the signals from the multipliers 116 is considered to be a relatively straight-forward means for accomplishing the goal of combining the values to obtain a combined spur cancellation signal. However, the adder 118 could more generally be referred to as a "combined spur cancellation signal computation engine" and could generate the combined spur cancellation signal in an applicable known or convenient manner.

It may be noted that a spur cancellation signal can refer to either the spur cancellation signal associated with a multiplier (see, e.g., FIG. 2, graph 200A) or a spur cancellation signal that combines multiple spur cancellation signals, $s_n$. It may be further noted that for M=1, the spur cancellation signal $s_n$ is, the same as the single spur cancellation signal output from a multiplier. While it is unlikely to be necessary in this paper, to be more precise the spur cancellation signal associated with each multiplier could be referred to as a "spur cancellation signal for a given frequency" and the signal $s_n$ could be referred to as a "spur cancellation signal for all frequencies" or a "combined spur cancellation signal."

In the specific embodiment of the spur cancellation engine 110 in FIG. 1, the calibration engine 120 can find spur frequencies during a calibration (or recalibration) routine. The calibration routine may take place during quiet times. Alternatively, the calibration routine could take place less frequently, such as at installation, configuration, or start-up. Frequencies of spurs are typically known in advance, because clock frequencies are known, and a power spectral density (PSD) measurement can be made to determine the dominant spur frequencies. So it might even be desirable to measure the spur frequencies at the time of fabrication or testing, and perform the calibration routine to find spur frequencies at that time. Since frequencies can drift due to environmental factors, the most likely being temperature, it may be desirable to recalibrate periodically, when there is time, or when certain environmental conditions are detected, though it is certainly possible to do away with calibrations to find spur frequencies prior to deployment, or just once (or only rarely) once deployed. It may be noted that although the calibration engine 120 can be implemented in the spur cancellation engine 110, this is not a requirement. For example, if the frequency of spurs are found at the time of fabrication or testing, the calibration engine 120 could conceivably be removed afterwards. However, in a typical implementation, the calibration engine 120 would still be useful in estimating phase and amplitude.

Unlike frequency, phases depend on, for example, the timing relation between clocks that generate spurs, board trace lengths, and the ADC clock that generates received samples. Amplitudes depend on, for example, gain through the receiver and the level at which a spur was coupled into an RFIC. So phase and amplitude are unlikely to be known in advance; it may be desirable to estimate phase and amplitude during quiet periods. To this end, the calibration engine 120 can compute the coefficients B during quiet times. Where the calibration engine 120 computes only the coefficients B, and does not attempt to find spur frequencies with recalibration, the calibration engine 120 could be referred to more narrowly as a coefficient computation engine.

It was determined that spurs from parasitic clock signals coupling through board traces manifest themselves as several tones, and are well-modeled by sinusoids. However, other noises may be better modeled using other bases (e.g., wavelet basis). If there are other (non-white) noises that are not well-modeled by a few sinusoids, the basis function used in spur cancellation technique may be modified to better model the particular spurs.

Figure 3:
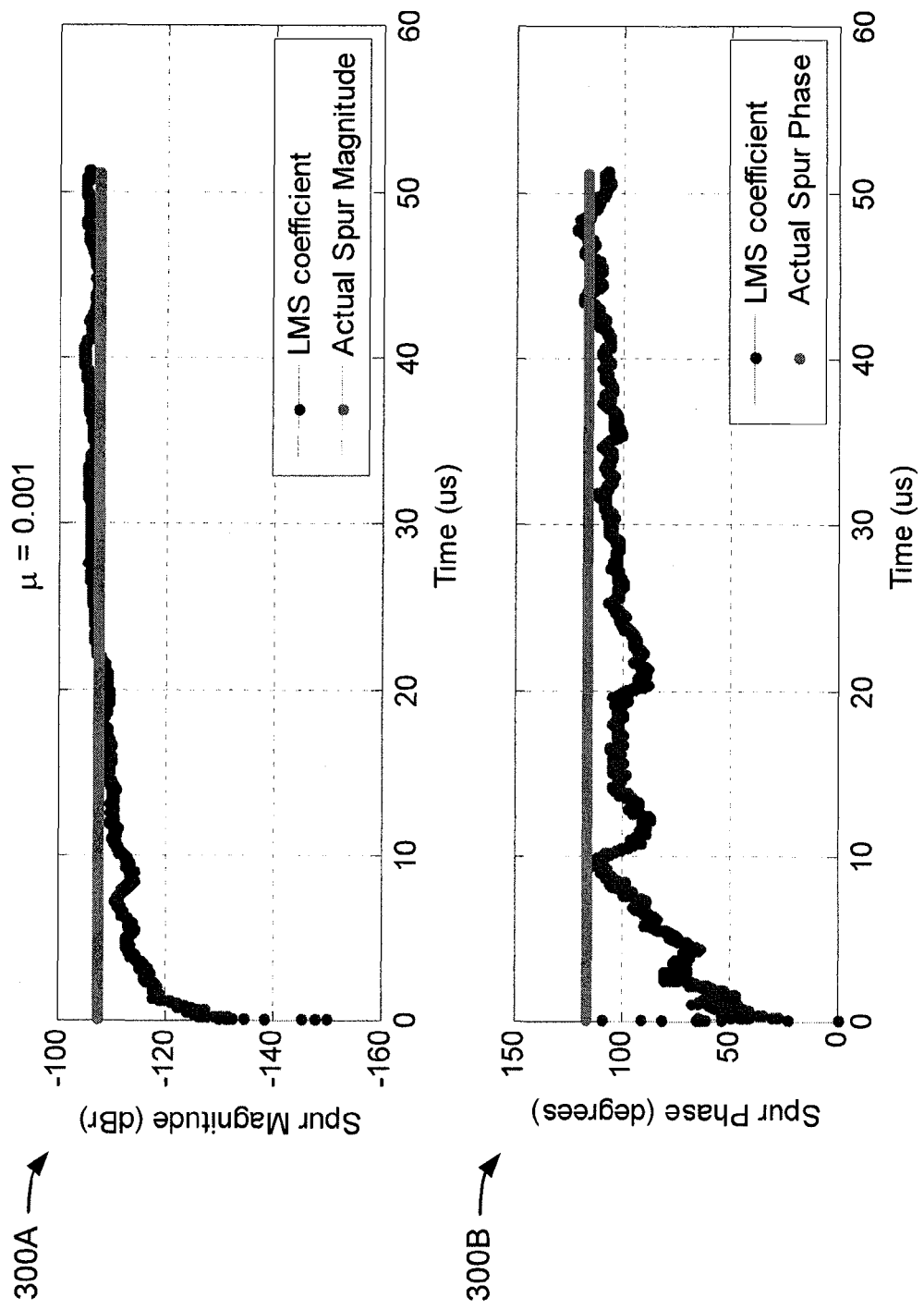
FIG. 3 depicts graphs and conceptually illustrating a simulation example with least mean squares coefficients.

A least means squares (LMS) adaptation of spur coefficients is $B_m[n+1]=B_m[n]+\mu z_n \exp(-j2\pi f_m n)$. (Note: a numerically-controlled oscillator (NCO) for LMS adaptation is a conjugate of an NCO for $s_n$.) FIG. 3 depicts graphs 300A and 300B conceptually illustrating a simulation example with LMS coefficients. (Note: Actual spur magnitude is plotted as a horizontal line segment in each of the graphs.)

Figure 4:
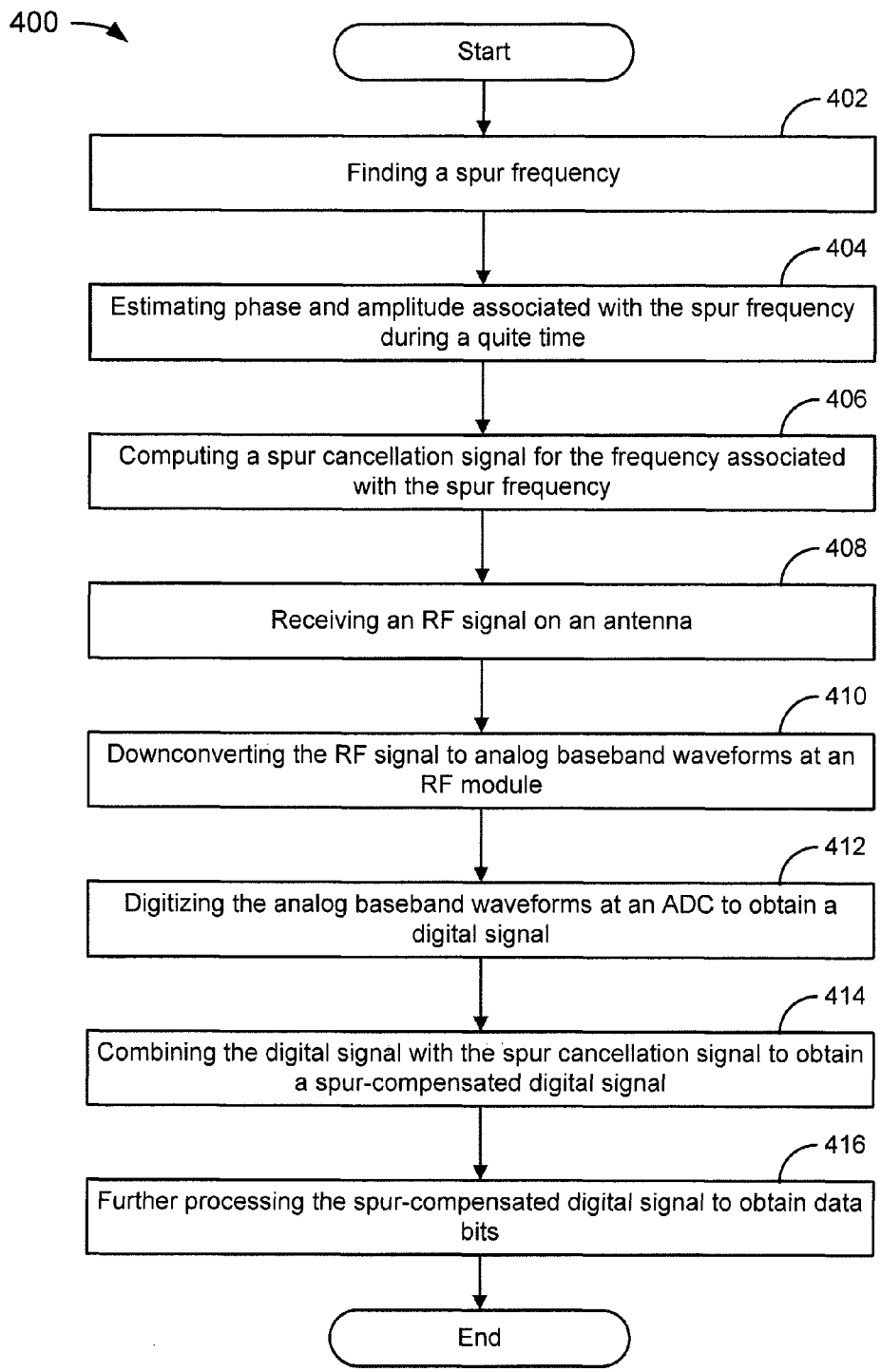
FIG. 4 depicts a flowchart of an example of a method for spur cancellation of signal-dependent spurs on a receiver.

FIG. 4 depicts a flowchart 400 of an example of a method for spur cancellation of signal-dependent spurs on a receiver. This method and other methods are depicted as serially arranged modules. However, modules of the methods may be reordered, or arranged for parallel execution as appropriate. This and other methods described in this paper can be implemented on a machine such as was described by way of example with reference to FIG. 1.

In the example of FIG. 4, the flowchart 400 starts at module 402 with finding a spur frequency. Since the spur frequency can be found in advance using, for example, a PSD measurement, it is possible to find the spur frequency prior to receiving a signal. Thus, the spur frequency could be found during fabrication of a chip, during testing of the chip, prior to deployment of a chip, when configuring the chip for use, during a start-up routine, or during calibration. It is also possible to find the spur frequency during a quiet time, which can be referred to as a "recalibration."

In the example of FIG. 4, the flowchart 400 continues to module 404 with estimating phase and amplitude associated with the spur frequency during a quiet time. Since phase and amplitude are generally not known in advance, it is generally not possible to estimate phase and amplitude prior to calibration, and phase and amplitude may need to be estimated again during recalibration.

In the example of FIG. 4, the flowchart 400 continues to module 406 with computing a spur cancellation signal for the frequency associated with the spur frequency. The phase and amplitude can be associated with a coefficient, and the coefficient can be combined with a value that is associated with the spur frequency.

In the example of FIG. 4, the flowchart 400 continues to module 408 with receiving an RF signal on an antenna, to module 410 with downconverting the RF signal to analog baseband waveforms at an RF module, and to module 412 with digitizing the analog baseband waveforms at an ADC to obtain a digital signal. Spurs of known frequency can be introduced into the digital signal for a number of reasons associated with the physical characteristics of a circuit. The spurs are not desirable and can result in a degradation of performance if they are not cancelled.

In the example of FIG. 4, the flowchart 400 continues to module 414 with combining the digital signal with the spur cancellation signal to obtain a spur-compensated digital signal. Advantageously, compensating for the spur can improve the performance.

In the example of FIG. 4, the flowchart 400 ends with further processing the spur-compensated digital signal to obtain data bits. Advantageously, the spur-compensated digital signal can be further processed using known or convenient techniques. Although the flowchart 400 ends at module 416, it may be noted that the flowchart 400 could return to module 408 and continue as described previously. Moreover, if there is a quiet time, the flowchart 400 could return to module 404 to obtain a new phase and amplitude, which can change over time, and continue as described previously. Also, optionally, the flowchart 400 could return to module 402 to find a new spur frequency, since frequency can drift over time, and continue as described previously.

Systems described herein may be implemented on any of many possible hardware, firmware, and software systems. Algorithms described herein are implemented in hardware, firmware, and/or software that is implemented in hardware. The specific implementation is not critical to an understanding of the techniques described herein and the claimed subject matter.

As used in this paper, an engine includes a dedicated or shared processor and, hardware, firmware, or software modules that are executed by the processor. Depending upon implementation-specific or other considerations, an engine can be centralized or its functionality distributed. An engine can include special purpose hardware, firmware, or software embodied in a computer-readable medium for execution by the processor. As used in this paper, the term "computer-readable storage medium" is intended to include only physical media, such as memory. As used in this paper, a computer-readable medium is intended to include all mediums that are statutory (e.g., in the United States, under 35 U.S.C. 101), and to specifically exclude all mediums that are non-statutory in nature to the extent that the exclusion is necessary for a claim that includes the computer-readable medium to be valid. Known statutory computer-readable mediums include hardware (e.g., registers, random access memory (RAM), non-volatile (NV) storage, to name a few), but may or may not be limited to hardware.

As used in this paper, the term "embodiment" means an embodiment that serves to illustrate by way of example but not necessarily by limitation.

As used in this paper, a "quiet period" is a period during which no desired signal is being received.

It will be appreciated to those skilled in the art that the preceding examples and embodiments are exemplary and not limiting to the scope of the present invention. It is intended that all permutations, enhancements, equivalents, and improvements thereto that are apparent to those skilled in the art upon a reading of the specification and a study of the drawings are included within the true spirit and scope of the present invention. It is therefore intended that the following appended claims include all such modifications, permutations and equivalents as fall within the true spirit and scope of the present invention.

The invention claimed is:

1. A system comprising:
an analog-to-digital converter (ADC);
a spur cancellation engine coupled to the ADC;
wherein, in operation:
   the ADC digitizes an analog waveform to produce a digital signal, wherein the digital signal includes signal-dependent spurs;
   the spur cancellation engine combines the digital signal with a spur cancellation signal to produce a spur-compensated digital signal;
a signal combiner in the spur cancellation engine;
wherein, in operation, the digital signal and a spur cancellation signal are combined at the signal combiner to produce the spur-compensated digital signal;
a spur cancellation signal computation engine coupled to the signal combiner;
wherein, in operation, the spur cancellation signal computation engine combines a coefficient B, where B[n] are adaptive spur cancellation amplitudes and phases at time n, with a value $\exp(j2\pi fn)$, where f is a frequency of a spur, to obtain the spur cancellation signal with a value $B[n]\exp(j2\pi fn)$.

2. The system of claim 1, wherein the analog waveform is an analog baseband waveform, further comprising:
an antenna;
a radio frequency (RF) module coupled to the antenna and the ADC;
wherein, in operation:
   an RF signal is received at the antenna;
   the RF signal is downconverted to the analog waveform at the RF module.

3. The system of claim 1, further comprising:
an additional signal processing engine coupled to the spur cancellation engine;
wherein, in operation, the additional signal processing engine processes the spur-compensated digital signal to obtain data bits.

4. The system of claim 1, wherein the signal combiner is an adder, further comprising:
a plurality of spur cancellation signal computation engines coupled to the signal combiner;
a combined spur cancellation signal computation engine coupled to the plurality of spur cancellation signal computation engines and the signal combiner;
wherein, in operation,
   the spur cancellation signal computation engines each combine a coefficient associated with adaptive spur cancellation amplitudes and phases at time n, with a value that is associated at least in part with a frequency of a respective spur at time n, to obtain the spur cancellation signals for the respective frequencies;

the combined spur cancellation signal computation engine combines the spur cancellation signals for the respective frequencies to obtain the spur cancellation signal.

5. The system of claim 1, further comprising:
a calibration engine;
wherein, in operation, the calibration engine estimates phase and amplitude in association with a spur frequency during a quiet period, and the spur cancellation signal is adjusted in accordance with the estimated phase and amplitude.

6. The system of claim 1, further comprising:
a calibration engine;
wherein, in operation, the calibration engine finds a spur frequency during a quiet period, and the spur cancellation signal is adjusted in accordance with the frequency that was found.

7. The system of claim 1, wherein, prior to operation, a calibration engine finds a spur frequency, and wherein, in operation, the spur cancellation signal is adjusted in accordance with the frequency that was found.

8. A system comprising:
a means for digitizing an analog waveform to produce a digital signal, wherein the digital signal includes signal-dependent spurs;
a means for combining the digital signal with a spur cancellation signal to produce a spur-compensated digital signal;
a means for combining a coefficient B, where B[n] are adaptive spur cancellation amplitudes and phases at time n, with a value $\exp(j2\pi fn)$, where f is a frequency of a spur, to obtain the spur cancellation signal with a value $B[n]\exp(j2\pi fn)$.

9. The system of claim 8, wherein the analog waveform is an analog baseband waveform, further comprising:
a means for receiving a radio frequency (RF) signal;
a means for downconverting the RF signal to the analog waveform.

10. The system of claim 8, further comprising a means for processing the spur-compensated digital signal to obtain data bits.

11. The system of claim 8, further comprising:
a means for combining each of a plurality of coefficients associated with adaptive spur cancellation amplitudes and phases at time n, with each of a plurality of values associated at least in part with a frequency of respective spurs at time n, to obtain a plurality of spur cancellation signals for the respective frequencies;
a means for combining the plurality of spur cancellation signals for the respective frequencies to obtain the spur cancellation signal.

12. The system of claim 8, further comprising:
a means for estimating phase and amplitude in association with a spur frequency during a quiet period;
a means for adjusting the spur cancellation signal in accordance with the estimated phase and amplitude.

13. The system of claim 8, further comprising:
a means for finding a spur frequency during a quiet period;
a means for adjusting the spur cancellation signal in accordance with the frequency that was found.

14. The system of claim 8, further comprising:
a means for finding a spur frequency prior to operation;
a means for adjusting the spur cancellation signal in accordance with the frequency that was found in operation.

15. A system comprising:
an analog-to-digital converter (ADC);
a spur cancellation engine coupled to the ADC;
wherein, in operation:
the ADC digitizes an analog waveform to produce a digital signal, wherein the digital signal includes signal-dependent spurs;
the spur cancellation engine combines the digital signal with a spur cancellation signal to produce a spur-compensated digital signal;
a signal combiner in the spur cancellation engine;
wherein, in operation, the digital signal and a spur cancellation signal are combined at the signal combiner to produce the spur-compensated digital signal;
a plurality of spur cancellation signal computation engines coupled to the signal combiner;
a combined spur cancellation signal computation engine coupled to the plurality of spur cancellation signal computation engines and the signal combiner;
wherein, in operation,
the spur cancellation signal computation engines each combine a coefficient associated with adaptive spur cancellation amplitudes and phases at time n, with a value that is associated at least in part with a frequency of a respective spur at time n, to obtain the spur cancellation signals for the respective frequencies;
the combined spur cancellation signal computation engine combines the spur cancellation signals for the respective frequencies to obtain the spur cancellation signal.

16. The system of claim 15, wherein the analog waveform is an analog baseband waveform, further comprising:
an antenna;
a radio frequency (RF) module coupled to the antenna and the ADC;
wherein, in operation:
an RF signal is received at the antenna;
the RF signal is downconverted to the analog waveform at the RF module.

17. The system of claim 15, further comprising:
an additional signal processing engine coupled to the spur cancellation engine;
wherein, in operation, the additional signal processing engine processes the spur-compensated digital signal to obtain data bits.

18. The system of claim 15, further comprising:
a calibration engine;
wherein, in operation, the calibration engine estimates phase and amplitude in association with a spur frequency during a quiet period, and the spur cancellation signal is adjusted in accordance with the estimated phase and amplitude.

19. The system of claim 15, further comprising:
a calibration engine;
wherein, in operation, the calibration engine finds a spur frequency during a quiet period, and the spur cancellation signal is adjusted in accordance with the frequency that was found.

20. The system of claim 15, wherein, prior to operation, a calibration engine finds a spur frequency, and wherein, in operation, the spur cancellation signal is adjusted in accordance with the frequency that was found.

21. A system comprising:
a means for digitizing an analog waveform to produce a digital signal, wherein the digital signal includes signal-dependent spurs;
a means for combining the digital signal with a spur cancellation signal to produce a spur-compensated digital signal;

a means for combining each of a plurality of coefficients associated with adaptive spur cancellation amplitudes and phases at time n, with each of a plurality of values associated at least in part with a frequency of respective spurs at time n, to obtain a plurality of spur cancellation signals for the respective frequencies;

a means for combining the plurality of spur cancellation signals for the respective frequencies to obtain the spur cancellation signal.

22. The system of claim 21, wherein the analog waveform is an analog baseband waveform, further comprising:
a means for receiving a radio frequency (RF) signal;
a means for downconverting the RF signal to the analog waveform.

23. The system of claim 21, further comprising a means for processing the spur-compensated digital signal to obtain data bits.

24. The system of claim 21, further comprising:
a means for estimating phase and amplitude in association with a spur frequency during a quiet period;
a means for adjusting the spur cancellation signal in accordance with the estimated phase and amplitude.

25. The system of claim 21, further comprising:
a means for finding a spur frequency during a quiet period;
a means for adjusting the spur cancellation signal in accordance with the frequency that was found.

26. The system of claim 21, further comprising:
a means for finding a spur frequency prior to operation;
a means for adjusting the spur cancellation signal in accordance with the frequency that was found in operation.

\* \* \* \* \*